United States Patent [19]

Carpenter et al.

[11] Patent Number: 5,287,046
[45] Date of Patent: Feb. 15, 1994

[54] METHOD AND SYSTEM FOR ACTUATOR CONTROL FOR DIRECT ACCESS STORAGE DEVICES

[75] Inventors: Gary D. Carpenter, Endwell, N.Y.; Robert E. Jansen, Byron, Minn.; Eugene F. Plutowski; John J. Stephenson, both of Rochester, Minn.

[73] Assignee: International Business Machines Corporation, Armonk, N.Y.

[21] Appl. No.: 882,197

[22] Filed: May 13, 1992

[51] Int. Cl.⁵ .................................................. H02P 1/22
[52] U.S. Cl. ......................................... 318/293; 388/815; 388/903; 388/907.2
[58] Field of Search ............... 388/907.2, 803–821; 318/293, 294, 281, 287–292; 361/30–31, 88–93

[56] References Cited

U.S. PATENT DOCUMENTS

| | | | |
|---|---|---|---|
| 3,121,834 | 2/1964 | Wruck | 318/294 |
| 3,427,520 | 2/1969 | Oppendahl | 318/294 |
| 4,276,484 | 6/1981 | Riveros | 361/159 X |
| 4,336,562 | 6/1982 | Kotowski | 318/294 |
| 4,581,565 | 4/1986 | Van Pelt et al. | 318/294 |
| 4,616,305 | 10/1986 | Damiano et al. | 318/293 |
| 4,654,568 | 3/1987 | Mansmann | 318/293 |
| 4,677,356 | 6/1987 | Tsunda et al. | 318/293 X |
| 4,680,513 | 7/1987 | Kennedy | 318/293 X |
| 4,710,686 | 12/1987 | Guzik | 318/293 X |
| 4,816,726 | 3/1989 | Novis et al. | 318/293 |
| 4,859,916 | 8/1989 | McCambridge | 318/293 X |
| 4,879,641 | 11/1989 | Rossi et al. | 318/293 |
| 4,937,802 | 6/1990 | Omori et al. | 369/13 |
| 4,967,291 | 10/1990 | Touchton et al. | 388/806 X |
| 5,061,902 | 10/1991 | Carpenter | 330/264 |

Primary Examiner—William M. Shoop, Jr.
Assistant Examiner—David Martin
Attorney, Agent, or Firm—Andrew J. Dillon; Paul W. O'Malley

[57] ABSTRACT

A method of operating bridge circuit for control of an inductive load is disclosed. The bridge circuit has a pair of input terminals for connection across a power source and a pair of output terminals for connection across the inductive load. Each arm of the bridge includes a transistor switch connecting an input terminal with an output terminal. Clamp circuits are connected to each pair of input and output terminals, taking inputs therefrom and responding to a transition through a predetermined voltage differential between the terminals for driving the transistor switch connecting the output terminal to the remaining input terminal, thereby limiting the output terminal to a predetermined voltage level.

11 Claims, 3 Drawing Sheets

METHOD AND SYSTEM FOR ACTUATOR CONTROL FOR DIRECT ACCESS STORAGE DEVICES

BACKGROUND OF THE INVENTION

1. Technical Field:

The invention relates to control of drive circuits for linear or rotary actuators in direct access storage devices, and, more particularly, to protecting electrical components of the direct access storage device from voltage transients associated with operation of either type of actuator. Still more particularly, the invention relates to limiting flyback voltage generated by inductive components of an actuator during operation while minimizing decay time of actuator current.

2. Description of the Related Art:

Direct access storage devices such as disk drives store data on rotating magnetic media disks. Recovery of data from or writing of data to a location on the disk requires positioning of a read/write transducer over the selected location. The transducer is typically carried on an arm which is moved to position the transducer. The arm may be of a type moved linearly across the disk or it may be of a type rotated in a fashion similar to the movement of the tone arm for record player. The actuators used to move the arms are also of two types, linear actuators and rotary actuators.

Certain features are common to both types of actuator. The actuators are direct current electric motors. Current is passed though the motor in one of two directions to generate a magnetic field to accelerate movement of the arm in a selected direction. Reversal of the current results in generation of an opposed magnetic field to accelerate the arm in the opposite direction. The magnetic field results from the current passing through a voice coil within the motor.

The prior art discloses numerous schemes for the control of acceleration, torque, velocity and position in a mechanical system driven by a direct current motor. Control comes through control of current through the motor. Though many control schemes exist, most rely on an H-bridge circuit connected at its input terminals across a direct current power source. The motor coil provides a load connected across the output terminals of the bridge. Each arm of the H-bridge circuit includes a switch. The output terminals of the bridge can be connected by closure of the appropriate switch to either input terminal. Closure of one pair of opposed switches supports a current through the motor in one direction. Opening of the first pair of switches and closure of the remaining pair of opposed switches supports a current through the motor in the opposite direction.

One problem is always encountered in any attempt to change the direction of current through a direct current electrical motor. A motor is an inductive load and accordingly a current through it cannot be interrupted. A change in the opposed pair of switches connecting the terminals of the load to the input terminals of the bridge will not instantly change the direction of current through the load. If such a change is attempted, the voltage on the terminals of the motor will rise to whatever level is required to create a path for the motor "flyback" current.

In some applications, return of the flyback current into the power source is acceptable. Guzik, in U.S. Pat. No. 4,710,686, teaches a motor control scheme using an H-bridge circuit. The inductive load is essentially connected across the output terminals f two bridge circuits, where one bridge circuit has a switching transistor in each arm, and the second bridge circuit has a diode in each arm. The diodes are oriented to provide a path for the flyback current back through the power source. A modified pulse width modulation scheme is used for closing opposed pairs of transistor switches to control current through the motor. The diodes "freewheel" after interruption of a current path through one of the two sets of transistor switches, passing current back to the power source while it decays. The scheme minimizes current decay time, which is generally desirable, but introduces a considerable power supply ripple, which in some applications is unacceptable.

U.S. Pat. No. 4,581,565 to Van Pelt et al. is another H-bridge type control circuit, directed, among other things, to reducing the ripple effects associated with changing motor current direction. A flyback current route is provided through a current switching transistor, which is isolated from the power source, and a freewheeling diode. However, decay of the flyback current is uncontrolled.

SUMMARY OF THE INVENTION

It is therefore one object of the present invention to provide for control of drive circuits for linear or rotary actuators in direct access storage devices.

It is another object to provide a method for minimizing voltage transients across of an inductive load to protect electrical components of a direct access storage device.

It is yet another object of the invention to provide a method for minimizing decay time of actuator current.

The foregoing objects are achieved as is now described. A bridge circuit having a pair of input terminals and a pair of output terminals is provided for driving an inductive load. The inductive load has a pair of input terminals connected across the output terminals of the bridge circuit. The input terminals of the bridge circuit are connected to both a power source for providing a first voltage level and to a conducting connection for providing a second voltage level. The output terminals of the bridge circuit may, through respective transistors in each leg of the bridge, be selectively connected to either the power source, or to the conducting connection. The transistors can be turned on and off in opposed pairs in response to control signals to apply voltage differentials across the inductive load for generating a current through the inductive load in one or its opposite direction.

A method of controlling voltage transients across the inductive load comprises the following steps. Control signals are provided to turn on an opposed pair of transistors to establish a current through the transistors and the inductive load. After establishment of the current through the inductive load, control signals are provided for turning off the opposed pair of transistors. The voltage differentials between voltage levels on the terminals of the inductive load versus the first and second voltage levels are monitored. Responsive to a transition through a first predetermined voltage differential between a terminal of the inductive load and the second voltage level, driving the transistor connecting that terminal to the power source into operation to limit the voltage level on the terminal to substantially the second voltage level. Responsive to transition through a second predetermined voltage differential between a terminal of the inductive load the first voltage level, driving the transistor connecting that terminal to the conducting connection on, overriding the provided control signal, to limit the voltage level on the terminal to substantially the first voltage level.

The above as well as additional objects, features, and advantages of the invention will become apparent in the following detailed description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
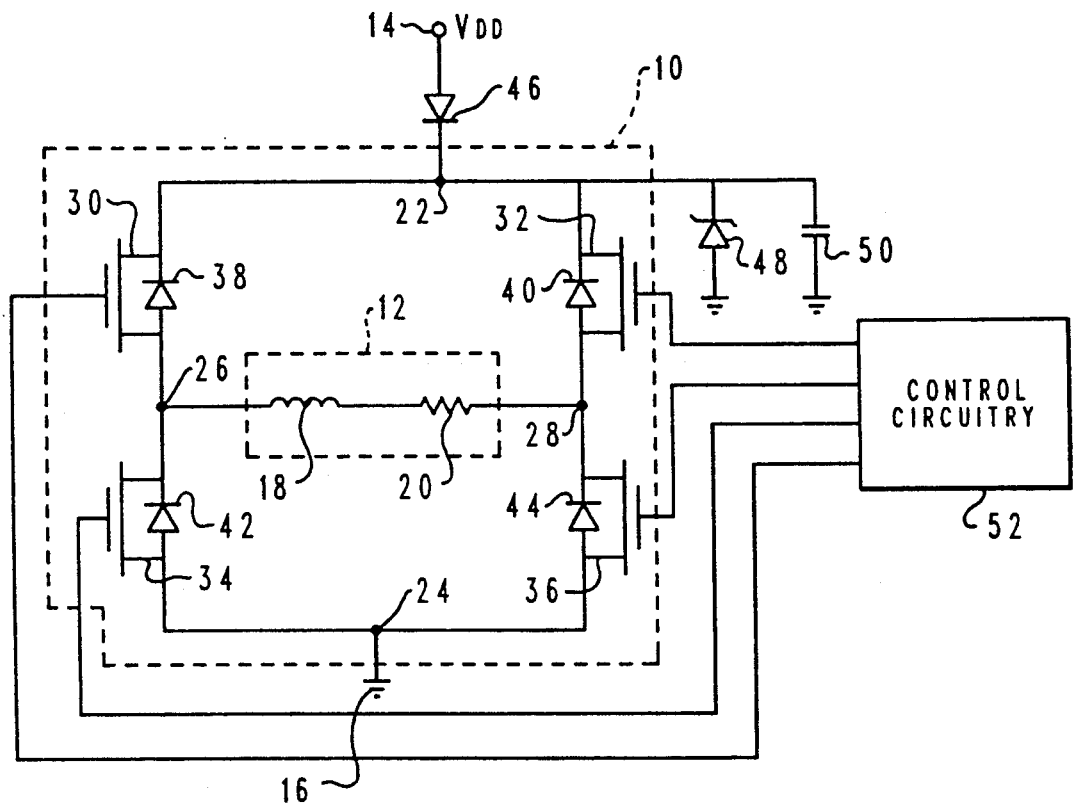
FIG. 1 is a schematic circuit diagram of a prior art direct access storage device actuator controller.

With reference now to the figures and in particular with reference to FIG. 1, there is depicted a circuit schematic for a prior art actuator controller 10. Actuator controller 10 supplies bi-directional direct current to a voice coil 12. Power is supplied to actuator controller 10 by connection of the controller between a positive power bus 14 caving a potential level $V_{dd}$ and a ground 16.

Voice coil 12 generates magnetic fields for displacing the physical actuation mechanism carrying a transducer of a disk drive read/write mechanism. The load imposed on actuator controller 10 by voice coil 12 is represented by an inductive component 18 and a resistive component 20. Those skilled in the art Will recognize that the representation of voice coil 12 is greatly simplified.

Actuator controller 10 is a conventional H-bridge circuit having two input terminals 22 and 24 and two output terminals 26 and 28. Voice coil 12 is connected between output terminals 26 and 28. Input terminal 22 is connected to each of output terminals 26 and 28 by metallic oxide semiconductor field effect transistors ("MOSFETs") 30 and 32, respectively. Input terminal 24 is connected to output terminals 26 and 28 by MOSFETs 34 and 36, respectively. One switching transistor is in each arm of the H-bridge circuit.

Associated with each MOSFET 30, 32, 34 and 36 is a parasitic diode 38, 40, 42 and 44, respectively. Diodes 42 and 44 are oriented to conduct current from ground 16 to the output terminals 26 and 28 and diodes 38 and 40 from the output terminals 26 and 28 to input terminal 22.

A protective diode 46 connects voltage power bus 14 to input terminal 22. Because $V_{dd}$ is positive with respect to ground, diode 46 is oriented to conduct current from power bus 14 to input 22, thereby preventing flyback currents from actuator controller 10 from reaching power bus 14 and thereby protecting the power supply from negative ripples. To control high voltage transients associated with changes in current direction through voice coil 12, input terminal 22 is also connected to a zener diode 48 and a storage capacitor 50. Zener diode 48 is oriented to conduct electricity from ground to input terminal 22 and accordingly exhibits a breakdown voltage to high positive voltages on node 22. Zener diode 48 limits maximum voltage transients on input terminal 22. Capacitor 50 is of large capacity and absorbs a substantial flyback current from voice coil 12. Gating of transistors 30, 32, 34 and 36 is provided by conventional control circuitry 52. In general, circuitry 52 provides control signals for turning on opposed pairs of transistor switches in alternation. Two such opposed pairs exist in actuator control 10, transistors 30 and 36 on the one hand and transistor 34 and 32 on the other. Control circuitry 52 includes sensing capability on each control line to prevent application of gating signals simultaneously to both transistors on either side of the bridge, e.g. MOSFETs 30 and 34.

In operation, control circuitry generates gating signals to MOSFETs 30, 32, 34 and 36 for generating a current through voice coil 12 in either of two directions. Suppose initially controller 10 is in tracking mode. The read/write transducer is being held over one of a plurality of concentric tracks of the rotating disk without substantial inward or outward movement of the transducer. Only minor bi-directional current flow occurs through coil 12 in response to small changes in the output potential at nodes 26 and 28 by operation of one or the other pairs of MOSFET switches.

Movement of the read/write transducer to another track requires establishment of a significant current through coil 12 to first accelerate the arm, then reversal of the current to de-accelerate the arm. For movement in one direction, MOSFETs 30 and 36 are turned on in unison to provide a conductive path from voltage power bus 14 through input terminal 22, through transistor 30 into voice coil 12, out of voice coil 12 through transistor 36 to ground to establish a current in a first direction. MOSFETs 32 and 34 are cut off and carry no current. After an initial time period, $t_1$, control signals may be applied to the transistors to reverse the pair in conductance, thereby tending to decrease the current through voice coil 12. In other words, transistors 30 and 36 are turned off and MOSFETs 32 and 34 are turned on opening a conductive path from power bus 14 through transistor 32, from there through voice coil 12, and from there through transistor 34 to ground 16. However, because voice coil 12 is inductive, the current cannot discontinuously change, much less instantly reverse. Accordingly, the voltage on terminal 26 begins to fall and the voltage on terminal 28 begins to rise. Current flows from ground to input terminal 22 through the newly saturated MOSFET pair 32 and 34 toward power supply $V_{dd}$. Even if turn on signals to MOSFETs 32 and 34 are absent, flyback current will flow through parasitic diodes 42 and 40. However, reverse current from input 22 to positive power bus 14 is blocked by diode 46. Accordingly, voltage rises on node 22 and current flows into capacitor 50. At some voltage threshold zener diode 48 begins to reverse conduct and a second current path is established to ground.

While diode 46 prevents ripples from occurring in power supply $V_{dd}$, it is extremely difficult, if not impossible, to integrate an appropriate zener diode or a large capacity capacitor. Accordingly, the devices must be provided by use of discrete components. The use of discrete components adds to the expense of the controller. Because of the sensitivity of other components of the direct access storage device such as the read/write transducer, to voltage transients, ripples in positive power bus voltage cannot be tolerated, and heretofore, the discrete components have been required. If devices 46, 48, 50 are not used then the $V_{dd}$ supply will see large negative current ripples which may not be acceptable, particularly in a disk drive application.

Figure 2:
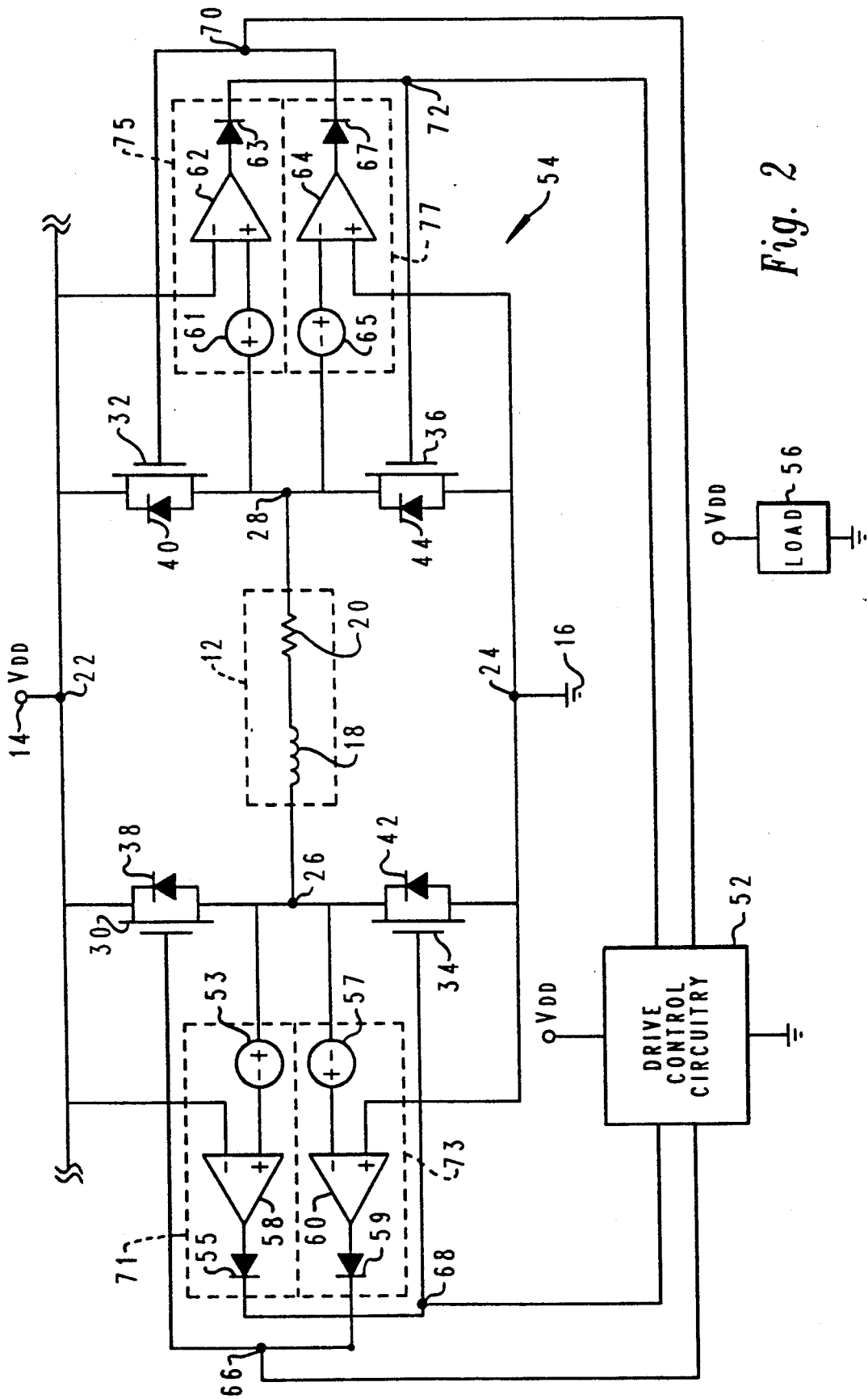
FIG. 2 is a schematic circuit diagram, partly in block diagram form, of the actuator controller in accordance with the present invention.

FIG. 2 depicts a circuit schematic, partly in block diagram form, of an improved bridge controller 54 for an actuator voice coil. Like numerals are used to describe like parts throughout with respect to a comparison of all figures of the present invention and FIG. 1 representing the prior art. H-bridge actuator controller 54 provides selective connection of input terminals 22 and 24 and output terminals 26 and 28. A voice coil 12 is connected between output terminals 26 and 28 for control of positioning of the physical actuation mechanism in a disk drive. Again, voice coil 12 is represented as a load including a series connected inductive component 18 and a resistive component 20. Within each arm of the H-bridge control circuit, that is between each input and output terminal, a transistor switch is provided, including MOSFET 30 connecting input terminal 22 and output terminal 26, MOSFET 34 connecting output terminal 26 and input terminal 24, MOSFET 36 between output terminal 28 and input terminal 24 and MOSFET 32 connecting input terminal 22 and output terminal 28. The gate of each MOSFET is connected to drive control circuitry 52 for selective application of a gating signal for turning the respective MOSFETs on and off The operation of drive control circuitry 52 to establish bi-directional direct currents through voice coil 12 is substantially the same as for the circuit of FIG. 1. Drive control circuitry 52 sinks (or sources) current for signals to the gates of MOSFETs 30, 32, 34 and 36 for turning the transistors on and off. Clamp circuits 71, 73, 75 and 77, when active, can source sufficient current to satisfy drive control circuitry 52 and maintain MOSFETs 34, 30, 36 and 32, respectively, on notwithstanding application of gate control signals for turning off the devices.

Also connected to positive Voltage power bus 14 is a load 56, representing the power required by various components of the direct access storage device such as the disk drive motor. Load 56 must be protected from voltage ripples in voltage level $V_{dd}$ appearing on power bus 14. It is also desired to protect a power bus corresponding to ground 16 from voltage ripples and associated noise problems from excessive voltage and current ripples.

The invention provides, in one aspect, limiting of the range of voltage levels permitted on nodes 26 and 28. Clamp circuit 71 provides for preventing voltage levels on node 26 from rising substantially above the level of power bus 14. Clamp circuit 71 includes a bias source 53, which supplies a voltage differential $V_1$, a transconductance amplifier 58 with a differential input and a diode 55. Amplifier 58 takes as one input, on its inverting input terminal, the voltage level $V_{dd}$. On its noninverting input terminal, amplifier 58 takes as an input the voltage level on node 26 offset by $V_1$ by bias source 53. $V_1$ is preferably between 100 and 400 millivolts assuring that as node 26 goes below $V_{dd}$, the noninverting terminal must be below $V_{dd}$ and amplifier 58 is off. The output of amplifier 58 is a current sourced through diode 55 to node 68 and thereby to the gate of MOSFET 39 when amplifier 58 is on.

Transconductance amplifier 58 provides differential voltage sensing between nodes 22 and 26 required to detect a voltage excursion on node 26 exceeding the supply voltage level $V_{dd}$. Transconductance amplifier 58 has a gain and compensation calculated to source the current required to drive MOSFET 34 into operation during a clamping period. Bias source 53 and diode 55 block effective operation of amplifier 58 during periods when upper range limiting is not required. Bias source 53 is set to offset the activation voltage of clamping circuit 71 to just above $V_{dd}$, but less than the voltage required to activate parasitic diode 42. Thus the voltage on node 26 can just exceed $V_{dd}$.

Figure 3:
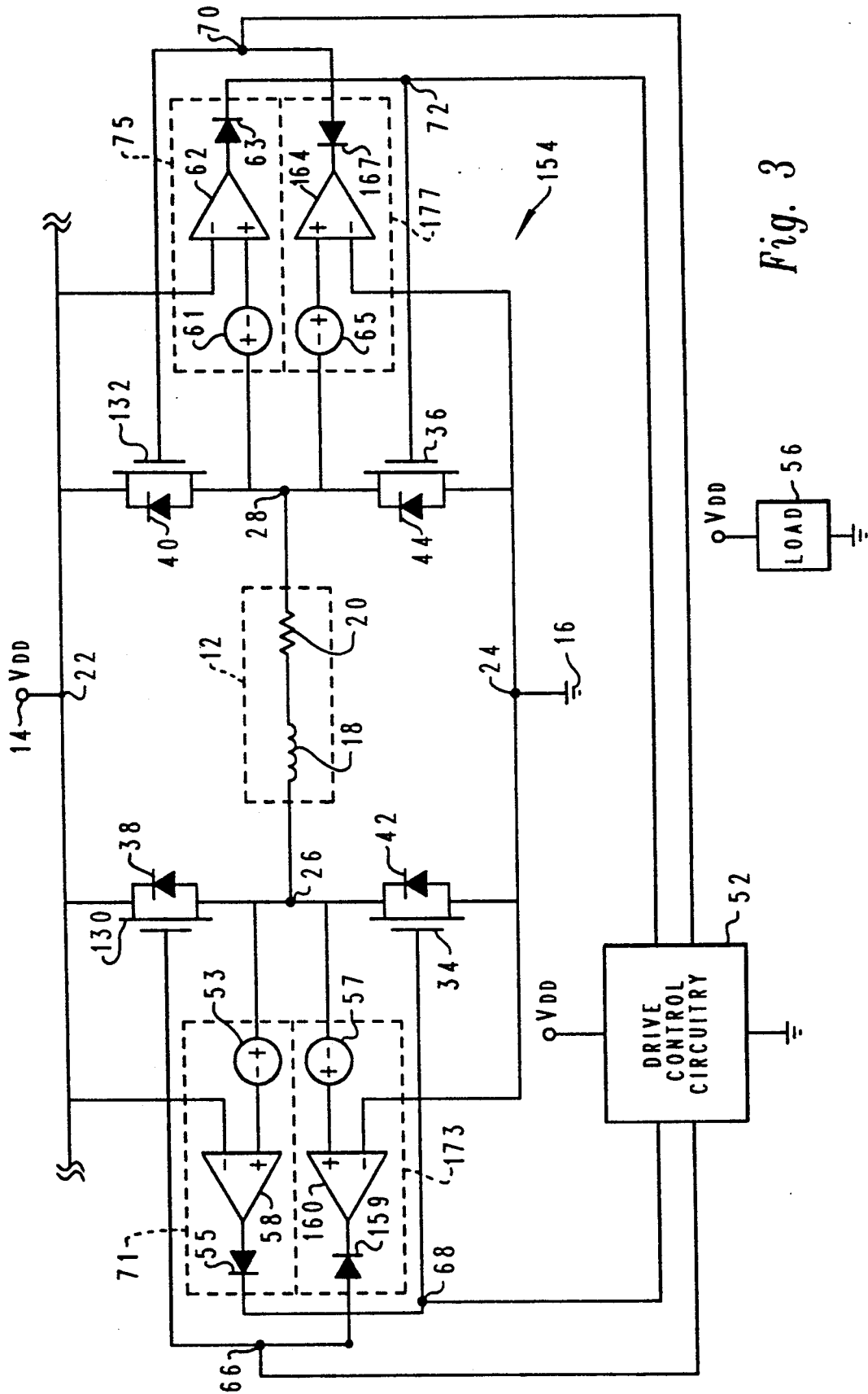
FIG. 3 is a schematic circuit diagram, partly in block diagram form, of an alternative embodiment of the actuator controller.

Bias source 53 and amplifier 58 are supplied with power from power bus 14, the connections for which are not shown for sake of simplicity. The actual circuits used to implement bias source 53 and transconductance amplifier 58 will vary depend on the capabilities of the technology used. Connections for P-type MOSFETs in the upper arms of a bridge circuit are shown in FIG. 3. The invention is equally applicable to a realization using bipolar technology instead of MOSFETs.

Clamp circuit 73 provides for preventing voltage levels on node 26 from falling substantially below the level of ground 16. Clamp circuit 73 includes bias source 57, a transconductance amplifier 60 with a differential input and a diode 59. Amplifier 60 takes as one input, on its noninverting input terminal, the voltage level of ground 16. On its inverting input terminal, amplifier 60 takes as an input the voltage level on node 26 offset by bias source 57. The output of amplifier 60 is a current, which is applied through diode 59 to node 66 and thereby to the gate of MOSFET 30 when positive.

Transconductance amplifier 60 provides differential voltage sensing between nodes 24 and 26, required to detect a voltage excursion on node 26 exceeding in the negative direction the voltage level of ground 16. Transconductance amplifier 60 has a gain and compensation calculated to source the current required to drive MOSFET 30 into operation during a clamping period. Bias source 57 and diode 59 block effective operation of amplifier 60 during periods when lower range limiting is not required. Bias source 57 is set to offset the activation voltage of clamping circuit 73 to just outside ground, but higher than the voltage required to activate parasitic diode 38. Thus the voltage level on node 26 can fall to slightly below ground.

Clamp circuit 75 provides for preventing voltage levels on node 28 from rising substantially above the level of power bus 14. Clamp circuit 75 includes a bias source 61, a transconductance amplifier 62 with a differential input and a diode 63. Amplifier 62 takes as one input, on its inverting input terminal, the voltage level $V_{dd}$. On its noninverting input terminal, amplifier 62 takes as an input the voltage level on node 28 offset by bias source 61. The output of amplifier 62 is a current, which is applied through diode 63 to node 72 and thereby to the gate of MOSFET 36 when positive.

Transconductance amplifier 62 provides differential voltage sensing between nodes 22 and 28 required to detect a voltage excursion on node 28 exceeding the supply voltage level $V_{dd}$. Transconductance amplifier 62 has a gain and compensation calculated to source the current required to drive MOSFET 36 into operation during a clamping period. Bias source 61 and diode 63 block effective operation of amplifier 62 during periods when upper range limiting is not required. Bias source 61 is set to offset the activation voltage of clamping circuit 75 to just outside $V_{dd}$, but less than the voltage required to activate parasitic diode 44. Thus the voltage on node 28 can exceed $V_{dd}$.

Clamp circuit 77 provides for preventing voltage levels on node 28 from falling substantially below the level of ground 16. Clamp circuit 77 includes bias source 65, a transconductance amplifier 64 with a differential input and a diode 67. Amplifier 64 takes as one input, on its noninverting input terminal, the voltage level of ground 16. On its inverting input terminal, amplifier 64 takes as an input the voltage level on node 28 offset by bias source 65. The output of amplifier 64 is a current, which is applied through diode 67 to node 70, and thereby to the gate of MOSFET 32 when positive.

Transconductance amplifier 64 provides differential voltage sensing between nodes 24 and 28 required to detect a voltage excursion on node 28 exceeding in the negative direction the voltage level of ground 16. Transconductance amplifier 64 has a gain and compensation calculated to source the current required to drive MOSFET 32 into operation during a clamping period. Bias source 65 and diode 67 block effective operation during periods when lower range limiting is not required. Bias source 65 is set to offset the activation voltage of clamping circuit 77 to just exceed below ground, but higher than the voltage required to activate parasitic diode 40. Thus the voltage on node 28 can just exceed ground. Four clamp circuits provide control of MOSFETs 30-36 to achieve such voltage level limiting. Each clamp circuit provides one range limit for an associated mode or output terminal of the H-bridge circuit.

An example of operation of control circuit 54 is now provided. Drive control circuitry 52 represents components of a disk drive for identification of a track, feedback signals for maintaining tracking and for generation of control signals for repositioning of a read/write transducer to that track. Initially, control circuit 52 is in a tracking mode, where read/write transducer is kept over one track. Drive control circuitry 52 generates gate signals to MOSFETs 30 and 36 or MOSFETs 34 and 32, to generate small bidirectional current levels, sufficient for small movements of an armature. Upon repositioning of the read/write transducer to another track, control signals are generated from control circuit 52 to drive transistors 32 and 34 into saturation providing a conductive path from a positive power bus 14 through input terminal 22, transistor 32, output terminal 28, voice coil 12, output terminal 26, transistor 34, input terminal 24 and ground 16. Physically, the armature carrying the transducer will accelerate. Prior to reaching the destination track, control circuit 52 generates control signals to turn off transistors 34 and 32. The voltage levels at output node 26 will quickly rise and fall at node 28 from a collapsing magnetic field in the inductive characteristic 18.

The rise in voltage level at node 26 above input terminal 22 by the $V_1$ offset is detected across the input terminals of transconductive amplifier 58 which generates a control signal driving MOSFET 34 and maintaining operation of the transistor. Similarly, the voltage drop on output terminal 28 compared with input terminal 24 is detected across the input terminals of transconductance amplifier 64. An output signal on node 70 from amplifier 64 driving transistor 32 maintains operation of the transistor. Thus the original conduction path through transistors 32 and 34 remains in operation while allowing a partial development of a reverse EMF across the actuator equal to the full supply to decay the current. As current drops to zero, MOSFETs 32 and 34 are gradually driven into cutoff, by amplifiers 64 and 58 allowing drive control circuitry 52 to drive MOSFETs 30 and 36 into full saturation, reversing the current through voice coil 12. At that point, the armature carrying the transducer begins to de-accelerate. Finally, MOSFETs 30 and 36 will be cutoff as the transducer arrives over the selected track, with the system returning to tracking mode.

FIG. 3 illustrates substitution of P-type MOSFETs 130 and 132 into the upper arms of the H-bridge actuator controller 154. Because use of P-type devices results in reversal of the polarity of gate control signals, transconductance amplifiers 173 and 177, controlling MOSFETs 130 and 132, respectively, differ from amplifiers 73 and 77. More particularly, diodes 159 and 167 are reversed in polarity Versus diodes 59 and 67, allowing the amplifiers to operate as current sinks. The inverting and noninverting terminals of amplifiers 160 and 164 are reversed compared with amplifiers 60 and 64.

Although the invention has been described With reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. A method of supplying current from a power source to an inductive load from first and second output terminals of a bridge circuit, the bridge circuit having a transistor switching element in each of four arms and first and second input terminals connected to receive power at first and second voltage levels, respectively, from the power source, the method comprising the steps of:

turning on a first diagonally opposed pair of transistor switching elements to establish a first direction current from the first voltage level through the first output terminal, the inductive load and the second output terminal to the second voltage level;

after establishment of the first direction current, providing control signals to turn off the first diagonally opposed pair of transistor switching elements;

comparing a voltage level on the first output terminal with the second voltage level to determine excursions past the second voltage level in a first direction;

responsive to excursions of the voltage level on the first output terminal past the second voltage level, driving the transistor switching element in an arm of the bridge circuit connecting the first output terminal to the power source at the first voltage level into active region operation to limit further change in the voltage level on the first output terminal in the first direction;

comparing a voltage level on the second output terminal with the first voltage level to determine excursions past the first voltage level in a second direction; and responsive to excursions the voltage level on the second output terminal past the first voltage level, driving the transistor switching element in an arm of the bridge circuit connecting the second output terminal to the power source at the second voltage level into active region operation to limit further change in the voltage level on the second output terminal in the second direction.

2. A method as set forth in claim 1, further comprising the step of:
responsive to cessation of the first direction current, providing control signals to turn on a second opposed pair of transistor switching elements to generate a voltage differential between the first and second output terminals across the inductive load for establishing a second direction current from the first power level, through the second pair of transistor switching elements, the second output terminal, the inductive load and the first output terminal to the second voltage level of the power source.

3. A bridge controller for driving an inductive load comprising:
first and second output terminals for connection to the inductive load;
a first input terminal for connection to a voltage source providing a first voltage level;
a second input terminal for connection to a voltage source providing a second voltage level;
four arms, each arm having a transistor switch, with a first arm connected between the first output terminal and the first input terminal, a second arm connected between the first output terminal and the second input terminal, a third arm connected between the second output terminal and the first input terminal and a fourth arm connected between the second output terminal and the second input terminal;
means for generating control signals for turning on the transistor switches in the first and fourth arms in unison;
means for generating control signals for turning on the transistor switches in the second and third arms in unison;
first clamp means responsive to a predetermined excursion of the voltage level on the first output terminal in a first direction relative to the second voltage level for driving the transistor switch in the first arm on; and
second clamp means responsive to a predetermined excursion of the voltage level on the second output terminal in the first direction relative to the second voltage level for driving the transistor switch in the third arm on.

4. The bridge controller of claim 3 and further comprising:
third clamp means responsive to a predetermined excursion of the voltage level on the first output terminal in a second direction relative to the first voltage level for driving the transistor switch in the second arm on; and
fourth clamp means responsive to a predetermined excursion of the voltage level on the second output terminal in a second direction relative to the first voltage level for driving the transistor switch in the fourth arm on.

5. A bridge controller for driving an inductive load as set forth in claim 4, wherein the inductive load is a voice coil in a linear or rotary actuator for a direct access storage device.

6. The bridge controller of claim 4 and further comprising:
means responsive to the first and fourth clamp means generating driving signals for inhibiting the means for generating control signals for turning on the transistor switches in the second and third arms; and
means responsive to the second and third clamp means generating driving signals for inhibiting the means for generating control signals for turning on the transistor switches in the first and fourth arms.

7. The bridge controller of claim 3 wherein:
the predetermined excursion allowed by the first clamp means on the first output terminal is substantially equal to the first voltage level; and
the predetermined excursion allowed by the second clamp means on the second output terminal is substantially equal to the first voltage level.

8. The bridge controller of claim 4 wherein:
the predetermined excursion allowed by the first clamp means on the first output terminal is substantially equal to the first voltage level;
the predetermined excursion allowed by the second clamp means on the second output terminal is substantially equal to the first voltage level;
the predetermined excursion allowed by the third clamp means on the first output terminal is substantially equal to the second voltage level; and
the predetermined excursion allowed by the fourth clamp means on the second output terminal is substantially equal to the second voltage level.

9. Apparatus for controlling current through an inductive load comprising:
a first potential source;
a second potential source;
a first transistor switch having a control node connected between the first potential source and a first terminal of the inductive load;
a second transistor switch having a control node connected between the second potential source and a second terminal of the inductive load;
a control signal source connected to the control nodes for applying control signals thereto for turning the first and second transistor switches on to establish a current through the inductive load; and
means responsive to development of a reverse electromagnetic field by the inductive load upon cutoff of control signals from the control signal source to the control nodes for applying signals to the control nodes to keep the first and second transistor switches on while the current decays.

10. The apparatus of claim 9 and further comprising:
a third transistor switch connected between the first potential source and a second terminal of the inductive load and having a control node;
a fourth transistor switch connected between the second potential source and a first terminal of the inductive load and having a control node;
the control signal source being connected to the control nodes for the third and fourth transistor switches for applying control signals and turning the third and fourth transistor switches on to establish a current through the inductive load from the second to the first terminals; and
means responsive to development of a reverse electromagnetic field by the inductive load upon cutoff of control signals from the control signal source to the control nodes for the third and fourth transistor switches for applying control signals to the control nodes for the third and fourth transistor switches to keep the third and fourth transistor switches on while the current decays.

11. The apparatus of claim 9 wherein the means responsive to development of a reverse electromagnetic field by the inductive load includes:

a comparator connected to the first terminal of the inductive load and to the second potential source for taking as inputs the signals appearing thereon, and further connected to the control node of the first transistor switch for applying a control signal thereto; and a comparator connected to the second terminal of the inductive load and to the first potential source for taking as inputs the signals appearing thereon, and further connected to the control node of the second transistor switch for applying a control signal thereto.

* * * * *